(12) United States Patent
K et al.

(10) Patent No.: US 12,101,096 B2
(45) Date of Patent: Sep. 24, 2024

(54) DIFFERENTIAL VOLTAGE-TO-DELAY CONVERTER WITH IMPROVED CMRR

(71) Applicant: Texas Instruments Incorporated, Dallas, TX (US)

(72) Inventors: Prasanth K, Ottapalam (IN); Eeshan Miglani, Chhindwara (IN); Visvesvaraya Appala Pentakota, Bengaluru (IN); Kartik Goel, Panipat (IN); Jagannathan Venkataraman, Bengaluru (IN); Sai Aditya Krishnaswamy Nurani, Hyderabad (IN)

(73) Assignee: Texas Instruments Incorporated, Dallas, TX (US)

( * ) Notice: Subject to any disclaimer, the term of this patent is extended or adjusted under 35 U.S.C. 154(b) by 328 days.

(21) Appl. No.: 17/182,339

(22) Filed: Feb. 23, 2021

(65) Prior Publication Data

US 2022/0271764 A1 Aug. 25, 2022

(51) Int. Cl.
*H03M 1/10* (2006.01)
*H03K 5/24* (2006.01)
(Continued)

(52) U.S. Cl.
CPC ........ *H03M 1/0612* (2013.01); *H03K 5/2481* (2013.01); *H03M 1/002* (2013.01); *H03M 1/1057* (2013.01)

(58) Field of Classification Search
CPC .... H03M 1/0617; H03M 1/124; H03M 1/164; H03M 1/0682; H03M 1/365;
(Continued)

(56) References Cited

U.S. PATENT DOCUMENTS

| 4,612,533 A | 9/1986 | Evans |
| 4,899,071 A | 2/1990 | Morales |

(Continued)

FOREIGN PATENT DOCUMENTS

| CN | 111064468 A | 4/2020 |
| EP | 3716486 A1 | 9/2020 |

(Continued)

OTHER PUBLICATIONS

U.S. Appl. No. 17/158,526, Notice of Allowance, dated Jan. 14, 2022, p. 8.

(Continued)

*Primary Examiner* — Linh V Nguyen
(74) *Attorney, Agent, or Firm* — Valerie M. Davis; Frank D. Cimino

(57) ABSTRACT

A voltage-to-delay converter converts input signals into delay signals, and includes: a first stage for receiving the input signals and for generating intermediate output signals, wherein timing of the intermediate output signals corresponds to voltages of the input signals, and wherein the first stage has a voltage source for providing a rail-to-rail voltage; and a second stage for receiving the intermediate output signals and for generating rail-to-rail output signals, wherein timing of the rail-to-rail output signals corresponds to the timing of the intermediate output signals, and wherein voltage of the rail-to-rail output signals corresponds to the rail-to-rail voltage. A voltage-to-delay converter block is also described. A circuit for receiving differential input signals, generating corresponding output signals, and removing common mode signals from the output signals is also described.

17 Claims, 7 Drawing Sheets

(51) Int. Cl.
*H03M 1/00* (2006.01)
*H03M 1/06* (2006.01)

(58) Field of Classification Search
CPC .... H03M 1/002; H03M 1/0863; H03M 1/203; H03M 1/363; H03M 1/44; H03M 1/462; H03M 1/466
USPC .......................................... 341/118–120, 135
See application file for complete search history.

(56) References Cited

U.S. PATENT DOCUMENTS

| | | | |
|---|---|---|---|
| 4,928,103 A | 5/1990 | Lane | |
| 5,317,721 A | 5/1994 | Robinson | |
| 5,495,247 A | 2/1996 | Yamamoto et al. | |
| 5,563,533 A | 10/1996 | Cave et al. | |
| 5,821,780 A | 10/1998 | Hasegawa | |
| 6,002,352 A | 12/1999 | El-Ghoroury et al. | |
| 6,046,612 A * | 4/2000 | Taft | G11C 27/026 327/337 |
| 6,060,912 A * | 5/2000 | Opris | H03K 3/35613 327/55 |
| 6,069,579 A | 5/2000 | Ito et al. | |
| 6,124,746 A | 9/2000 | Van Zalinge | |
| 6,144,231 A | 11/2000 | Goldblatt | |
| 6,314,149 B1 | 11/2001 | Daffron | |
| 6,377,200 B1 | 4/2002 | Lee | |
| 6,556,060 B1 * | 4/2003 | Dillon | H03K 3/356104 327/210 |
| 6,590,517 B1 | 7/2003 | Swanson | |
| 6,661,365 B1 | 12/2003 | Bugeja | |
| 6,720,895 B2 | 4/2004 | Poulton et al. | |
| 6,822,596 B2 | 11/2004 | Theiler | |
| 6,836,127 B2 | 12/2004 | Marshall | |
| 6,857,002 B1 | 2/2005 | Thomsen | |
| 7,046,179 B1 | 5/2006 | Taft et al. | |
| 7,142,138 B2 | 11/2006 | Chen et al. | |
| 7,233,172 B2 * | 6/2007 | Kanamori | G11C 7/065 327/55 |
| 7,262,724 B2 | 8/2007 | Hughes et al. | |
| 7,379,007 B2 | 5/2008 | Noguchi | |
| 7,379,010 B2 | 5/2008 | Tero | |
| 7,446,573 B1 * | 11/2008 | Miller | H03M 1/0682 327/52 |
| 7,501,862 B2 | 3/2009 | Su et al. | |
| 7,525,471 B2 * | 4/2009 | Prodi | H03M 1/502 341/157 |
| 7,557,746 B1 | 7/2009 | Waltari | |
| 7,738,265 B2 | 4/2010 | Trattler | |
| 7,737,875 B2 | 6/2010 | Waltari et al. | |
| 7,839,323 B2 | 11/2010 | Kidambi | |
| 7,847,576 B2 | 12/2010 | Koiima | |
| 7,884,748 B2 | 2/2011 | Dekagbes | |
| 7,916,064 B2 | 3/2011 | Lin et al. | |
| 7,919,994 B2 | 4/2011 | Walker | |
| 8,089,388 B2 | 1/2012 | Cui et al. | |
| 8,130,130 B2 | 3/2012 | Danjo et al. | |
| 8,183,903 B2 | 5/2012 | Glass et al. | |
| 8,373,444 B2 | 2/2013 | Lee et al. | |
| 8,421,664 B2 | 4/2013 | Ryu et al. | |
| 8,514,121 B1 | 8/2013 | Shu | |
| 8,558,725 B2 | 10/2013 | Kidambi | |
| 8,773,169 B2 | 7/2014 | Dinc et al. | |
| 8,810,282 B2 * | 8/2014 | Li | H03F 3/45179 327/54 |
| 8,836,375 B2 * | 9/2014 | Ghatak | H03K 5/249 327/65 |
| 8,896,476 B2 | 11/2014 | Harpe | |
| 9,350,374 B2 | 5/2016 | Sundblad et al. | |
| 9,369,137 B2 | 6/2016 | Masuko | |
| 9,379,007 B2 | 6/2016 | Arvin | |
| 9,455,695 B2 | 9/2016 | Kull et al. | |
| 9,467,160 B2 | 10/2016 | Chang | |
| 9,503,116 B2 | 11/2016 | Speir et al. | |
| 9,548,752 B1 | 1/2017 | Shrivastava et al. | |
| 9,559,716 B1 | 1/2017 | Matsui et al. | |
| 9,685,971 B2 | 6/2017 | Harada | |
| 9,742,424 B2 | 8/2017 | Sharma et al. | |
| 9,917,590 B2 | 3/2018 | Zhang et al. | |
| 10,003,353 B2 | 6/2018 | Kris et al. | |
| 10,103,753 B1 | 10/2018 | Nagarajan et al. | |
| 10,284,187 B1 * | 5/2019 | K. | H03M 3/458 |
| 10,284,188 B1 * | 5/2019 | Soundararajan | H03K 5/249 |
| 10,673,452 B1 | 6/2020 | Soundararajan | |
| 10,673,453 B1 | 6/2020 | Pentakota et al. | |
| 10,673,456 B1 | 6/2020 | Dusad et al. | |
| 10,778,243 B2 * | 9/2020 | Pentakota | H03K 5/2481 |
| 10,840,934 B2 | 11/2020 | Benjaram et al. | |
| 10,958,258 B2 | 3/2021 | Soundanarajan et al. | |
| 11,316,525 B1 | 4/2022 | Pentakota | |
| 11,316,526 B1 | 4/2022 | Rajagopal | |
| 2005/0104626 A1 * | 5/2005 | Wakamatsu | H03K 5/249 327/50 |
| 2006/0158365 A1 | 7/2006 | Kernahan et al. | |
| 2006/0220935 A1 | 10/2006 | Hughes et al. | |
| 2008/0297381 A1 | 12/2008 | Kernahan et al. | |
| 2009/0153388 A1 | 6/2009 | Waltari | |
| 2009/0243907 A1 | 10/2009 | Nazemi | |
| 2009/0302888 A1 * | 12/2009 | Shumarayev | H03K 19/018514 326/62 |
| 2010/0085101 A1 | 4/2010 | Walker | |
| 2010/0085232 A1 | 4/2010 | Nicolas | |
| 2010/0245149 A1 * | 9/2010 | Danjo | H03K 5/249 341/155 |
| 2011/0109348 A1 * | 5/2011 | Chen | H03K 5/2481 327/65 |
| 2011/0109488 A1 | 5/2011 | Nakajima | |
| 2011/0234440 A1 * | 9/2011 | Danjo | H03K 3/356139 330/253 |
| 2012/0105264 A1 | 5/2012 | Ryu et al. | |
| 2012/0176158 A1 * | 7/2012 | Lee | H03M 1/50 327/12 |
| 2012/0212358 A1 | 8/2012 | Shi et al. | |
| 2012/0326904 A1 | 12/2012 | Jensen | |
| 2013/0009796 A1 | 1/2013 | Sakiyama et al. | |
| 2013/0021118 A1 | 1/2013 | Kabir et al. | |
| 2013/0021189 A1 | 1/2013 | Kabir et al. | |
| 2013/0106632 A1 | 5/2013 | Petigny et al. | |
| 2013/0169463 A1 | 7/2013 | Stein et al. | |
| 2014/0361917 A1 | 12/2014 | Matsuno et al. | |
| 2015/0008894 A1 | 1/2015 | Cannankurichi et al. | |
| 2015/0244386 A1 | 8/2015 | El-Chammas | |
| 2015/0260552 A1 | 9/2015 | Yao et al. | |
| 2017/0117914 A1 | 4/2017 | Choi | |
| 2017/0214411 A1 | 7/2017 | Liu | |
| 2017/0230034 A1 * | 8/2017 | Wei | H03K 5/007 |
| 2019/0007071 A1 | 1/2019 | Nagarajan et al. | |
| 2019/0131997 A1 * | 5/2019 | Liu | H03M 1/46 |
| 2019/0280703 A1 | 9/2019 | Naru et al. | |
| 2019/0296756 A1 | 9/2019 | Ali | |
| 2020/0195268 A1 | 6/2020 | Soundararajan et al. | |
| 2020/0204184 A1 * | 6/2020 | Rattan | H03K 3/356191 |
| 2020/0259501 A1 | 8/2020 | Pentakota | |
| 2020/0259502 A1 | 8/2020 | Dusad et al. | |
| 2020/0403632 A1 | 12/2020 | Chen et al. | |
| 2021/0126644 A1 | 4/2021 | Sharma et al. | |
| 2021/0359694 A1 | 11/2021 | Chen et al. | |
| 2022/0224349 A1 | 7/2022 | Varshney et al. | |
| 2022/0247421 A1 | 8/2022 | Pentakota et al. | |
| 2022/0294461 A1 | 9/2022 | Huynh | |

FOREIGN PATENT DOCUMENTS

| | | |
|---|---|---|
| JP | H05206801 | 8/1993 |
| KR | 20000028857 | 5/2000 |
| KR | 2001044806 | 2/2001 |
| KR | 20020015863 | 3/2002 |

(56) References Cited

FOREIGN PATENT DOCUMENTS

| WO | 2004038922 | 5/2004 |
|---|---|---|
| WO | 2020233818 A1 | 11/2020 |

OTHER PUBLICATIONS

U.S. Appl. No. 16/517,796, Notice of Allowance, dated Feb. 6, 2020, p. 7.
U.S. Appl. No. 16/410,698, Notice of Allowance, dated Feb. 10, 2020, p. 6.
International Search Report in corresponding PCT Patent Application No. PCT/2018-068162, mailed Apr. 25, 2019 (2 pages).
International Search Report in corresponding PCT Patent Application No. PCT/2021-063021, mailed Mar. 31, 2022 (3 pages).
International Search Report in corresponding PCT Patent Application No. PCT/2021-064260, mailed Apr. 7, 2022 (3 pages).
International Search Report in corresponding PCT Patent Application No. PCT/2022-012066, mailed Apr. 7, 2022 (2 pages).
International Search Report in corresponding PCT Patent Application No. PCT/2022-013802, mailed Apr. 28, 2022 (2 pages).
International Search Report in corresponding PCT Patent Application No. PCT/2022-014532, mailed May 5, 2022 (2 pages).
Wu Tzu-Fan et al: "A Flash-Based Non-Uniform Sampling ADC With Hybrid Quantization Enabling Digital Anti-Aliasing Filter", IEEE Journal of Solid-State Circuits, IEEE, USA, vol. 52, No. 9, Sep. 1, 2017 (Sep. 1, 2017), pp. 2335-2349, XP011659292, ISSN: 0018-9200, DOI: 10.1109/JSSC.2017.2718671 [retrieved on Aug. 23, 2017].
Yi Il-Min et al: "A 4-GS/s 11.3-mW 7-bit Time-Based ADC With Folding Voltage-to-Time Converter and Pipelined TDC in 65-nm CMOS", IEEE Journal of Solid-State Circuits, IEEE, USA, vol. 56, No. 2, Oct. 5, 2020 (Oct. 5, 2020), pp. 465-475, XP011834558, ISSN: 0018-9200, DOI: 10.1109/JSSC.2020.3025605.
Zhang Minglei et al: "An 8-Bit 10-GS/s 16x Interpolation-Based Tim••Domain ADC With 1.5-ps Uncalibrated Quantization Steps", IEEE Journal of Solid-State Circuits, IEEE, USA, vol. 55, No. 12, Aug. 11, 2020 (Aug. 11, 2020), pp. 3225-3235, XP011821781, ISSN: 0018-9200, DOI: 10.1109/JSSC.2020.3012776 [retrieved on Nov. 23, 2020].
Extended European Search report for T100164EP01.
Extended European Search report for T100165EP01.
Extended European Search report for T91430EP01.
Liu Haizhu et al: "A high linear voltage-to-time converter (VTC) with 1.2?V input range for time-domain analog-to-digital converters", Microelectronics Journal, vol. 88 , pp. 18-24, XP085695194, ISSN: 0026-2692, DOI: 10.1016/J.MEJ0.2019.04.00.

\* cited by examiner

DIFFERENTIAL VOLTAGE-TO-DELAY CONVERTER WITH IMPROVED CMRR

BACKGROUND

An analog-to-digital (A/D) converter (ADC) may be used to generate digital codes which represent an analog signal. A radio-frequency (RF) sampling receiver, that includes an ADC, may be used to receive and digitize a high frequency analog signal. An analog-to-digital converter for digitizing a signal in a radio-frequency sampling receiver may be required to operate at high speed. Analog-to-digital converters are described in United States Patent Application Publications Nos. 2012/0212358 (Shi et al.), 2015/0244386 (El-Chammas), 2019/0007071 (Nagarajan et al.) and 2019/0280703 (Naru et al.).

Some analog-to-digital converters have one or more voltage-to-delay (V2D) components and operate, at least in part, in a delay domain. Delay-based analog-to-digital converters are described in U.S. patent application Ser. No. 16/217,643 (Soundararajan et al., filed Dec. 12, 2018) (U.S. Pub 2020/0195268 (Jun. 18, 2020)), Ser. No. 16/410,698 (Dusad et al., filed May 13, 2019) (U.S. Pat. No. 10,673,456 (Jun. 2, 2020)), and Ser. No. 16/517,796 (Pentakota et al., filed Jul. 22, 2019) (U.S. Pat. No. 10,673,453 (Jun. 20, 2020)). The entire disclosures of U.S. patent applications Ser. Nos. 16/217,643, 16/410,698 and 16/517,796 are incorporated herein by reference. In addition, the entire disclosures of the five U.S. patent applications identified below in Table 1 are incorporated herein by reference. Delay-based analog-to-digital converters may be operated, if desired, at high speed, with reduced area and power requirements.

TABLE 1

| Docket No. | Title | Inventors | Serial No. |
| --- | --- | --- | --- |
| TI-91409 | PIECEWISE CALIBRATION FOR HIGHLY NON-LINEAR MULTI-STAGE ANALOG-TO-DIGITAL CONVERTER | Narasimhan Rajagopal, Visvesvaraya Pentakota and Eeshan Miglani | 17/126,157 |
| TI-91427 | DELAY FOLDING SYSTEM AND METHOD | Eeshan Miglani, Visvesvaraya Pentakota and Chirag Chandrahas Shetty | 17/129,180 |
| TI-91430 | SAMPLING NETWORK WITH DYNAMIC VOLTAGE DETECTOR FOR DELAY OUTPUT | Eeshan Miglani, Visvesvaraya Pentakota, and Jaganathan Venkataraman | 17/131,981 |
| TI-91439 | LOOKUP-TABLE-BASED ANALOG-TO-DIGITAL CONVERTER | Visvesvaraya Pentakota, Narasimhan Rajagopal, Chirag Shetty, Prasanth K, Neeraj Shrivastava, Eeshan Miglani and Jagannathan Venkataraman | 17/158,526 |
| TI-91450 | GAIN MISMATCH CORRECTION FOR VOLTAGE-TO-DELAY PREAMPLIFIER ARRAY | Narasimhan Rajagopal, Chirag Shetty, Neeraj Shrivastava, Prasanth K and Eeshan Miglani | 17/133,745 |

SUMMARY

The present disclosure relates to a voltage-to-delay converter for converting input signals into delay signals. The voltage-to-delay converter includes: a first stage for receiving the input signals and for generating intermediate output signals, wherein timing of the intermediate output signals corresponds to voltages of the input signals, and wherein the first stage has a voltage source for providing a rail-to-rail voltage; and a second stage, connected to the first stage, for receiving the intermediate output signals and for generating rail-to-rail output signals, wherein timing of the rail-to-rail output signals corresponds to the timing of the intermediate output signals, and wherein voltage of the rail-to-rail output signals corresponds to the rail-to-rail voltage of the voltage source.

The present disclosure also relates to a voltage-to-delay converter block for converting input signals into delay signals, including: lines for receiving an analog signal of unknown voltage and a signal of known voltage; a multiplexer for selecting one of the analog signal of unknown voltage and the signal of known voltage, and for generating a selected signal; and a voltage-to-delay array for generating delay signals based on the selected signal; wherein the array includes voltage-to-delay converters, and wherein at least one of the converters includes: a first stage for receiving the input signals and for generating intermediate output signals, wherein timing of the intermediate output signals corresponds to voltages of the input signals; and a second stage, connected to the first stage, for receiving the intermediate output signals and for generating rail-to-rail output signals, wherein timing of the rail-to-rail output signals corresponds to the timing of the intermediate output signals.

The present disclosure also relates to a circuit for receiving differential input signals, generating corresponding output signals, and removing common mode signals from the output signals, wherein the circuit includes: receiving lines for receiving the differential input signals; output lines for outputting the output signals, and switches for selectively connecting the output lines to the input lines during a sampling phase; a middle node connected to the output lines by capacitors; and a device for discharging the common mode signals from the middle node during a reset phase, and thereby removing the common mode signals from the output lines.

The present disclosure also relates to a method of operating a voltage-to-delay converter, wherein the method includes: receiving an analog signal of unknown voltage having a common-mode voltage, receiving a signal of known voltage having a common-mode voltage, and using a comparator to compare the common-mode voltages to a reference voltage, and to generate a digital output signal based on the comparison; and using the digital output signal to change one or more of the analog signal of unknown voltage and the signal of known voltage such that the common mode voltages match each other.

BRIEF DESCRIPTION OF THE DRAWINGS

The same reference numbers or other feature designators are used in the figures to designate the same or similar features.

DETAILED DESCRIPTION

The present disclosure relates to an analog-to-digital converter system, and one or more devices for such a system, which may be used to sample an external radio-frequency analog signal, and to interface the analog signal to a digital signal processor (DSP). The system may include a receiver for receiving the analog signal, and a radio-frequency automatic frequency control (AFC) configuration for simplifying the receiver operation. If desired, devices constructed in accordance with the present disclosure may benefit from complementary metal-oxide-semiconductor (CMOS) scaling, a technology for producing low-power integrated circuits, and for improving digital circuit performance. Whereas the performance of traditional analog circuits generally does not improve much with complementary metal-oxide-semiconductor scaling, time (or delay)-to-digital devices generally do scale well when produced with complementary metal-oxide-semiconductor scaling.

The present disclosure relates in particular to one or more voltage-to-delay devices which may be used to generate delay signals based on input signals. According to one aspect of this disclosure, the delay signals generated by a voltage-to-delay device may be used by a time (or delay)-to-digital converter to generate digital codes representative of the voltages of the input signals. The present disclosure also relates to a voltage-to-delay block which can operate with improved linearity, improved common-mode rejection ratio (CMRR), low dissipation of power and small area requirements.

Figure 1:
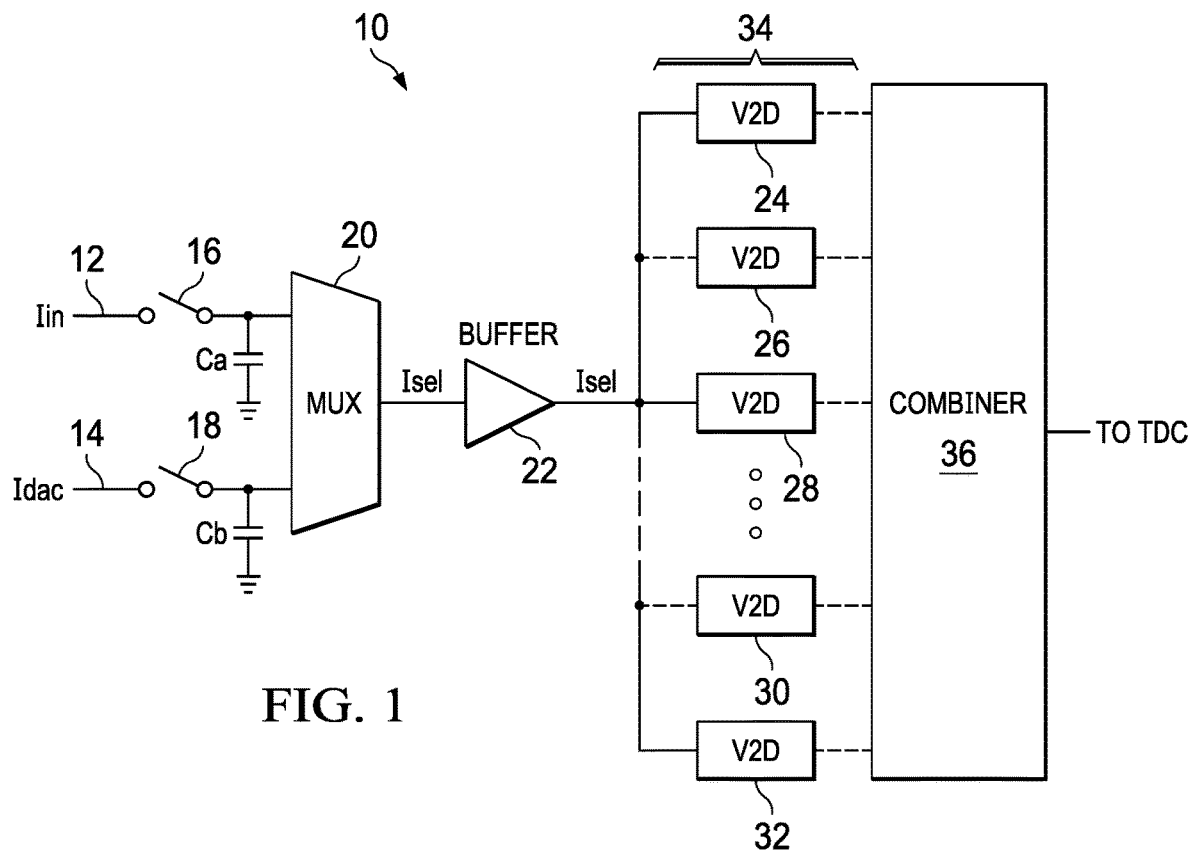
FIG. 1 is a block diagram of an example of a voltage-to-delay converter block.

FIG. 1 illustrates an analog-to-digital converter system 10 which has first and second receiver lines 12 and 14. The lines 12 and 14 selectively receive an analog input signal Iin of unknown voltage, and a signal Idac of known voltage, under the control of respective switches 16 and 18. If desired, the known-voltage signal Idac may be supplied by a digital-to-analog converter (DAC) (not illustrated). A multiplexer (MUX) 20, which may be an analog multiplexer, selects one of the signals Iin and Idac, and outputs the selected signal Isel to a buffer 22 which minimizes kickback from a voltage-to-delay array 34. Conductive lines from the switches 16 and 18 to the multiplexer 20 are connected to ground by suitable capacitors Ca and Cb.

From the buffer 22, the selected signal Isel is applied to N voltage-to-delay devices 24, 26, 28, 30 and 32. The N devices 24, 26, 28, 30 and 32 form the voltage-to-delay array 34, and N may be 1, 2, 3, 4, 5 or more. The voltage-to-delay devices 24, 26, 28, 30 and 32 generate respective output signals which are combined by a combiner 36. If desired, the voltage-to-delay devices 24, 26, 28, 30 and 32 may be, for example, pre-amplifiers. An output signal generated by the combiner 36 is outputted to a suitable time (or delay)-to-digital converter (TDC) (not illustrated). The time (or delay)-to-digital converter generates digital codes based on the output signal (from the combiner 36). The output signal is representative of voltages of the selected signal Isel. If desired, the time (or delay)-to-digital conversion may use zone information from the voltage-to-digital array 34 to determine the most significant bit or bits of the codes, and residual delay information in successive delay-based elements to resolve less-significant bits of the codes. In the illustrated example, the array 34 may be the front end of a pipeline-type delay-to-digital converter. A similar implementation is illustrated in U.S. Pat. No. 10,673,453 which is hereby incorporated by reference in its entirety.

In the example illustrated in FIG. 1, one or more of the voltage-to-delay devices 24, 26, 28, 30 and 32 operates in a non-linear fashion, but may be calibrated using the known-voltage signal Idac. If desired, the known signal Idac can be used to linearize the non-linear block 34 by characterizing aspects of the non-linear block 34. If desired, an appropriate look-up table (LUT) may be generated based on the voltage of the known signal Idac and the digital value determined by the back-end delay-to-digital converter, for different voltage values of the known signal Idac.

The voltage-to-delay devices 24, 26, 28, 30 and 32 may each have a circuit 50 (FIG. 4) for generating a threshold voltage Vth for use in generating an in-built threshold voltage for comparison to differential voltage components Vinm and Vinp of the selected and buffered input signal Isel. The in-built threshold voltages may have different voltage values. In operation, the different devices 24, 26, 28, 30 and 32 may have different input-dependent common-mode rejection ratios. As described in more detail below, each circuit 50 may be connected to the bulks of transistors 108 and 110 (FIGS. 2, 7 and 10) of a respective preamplifier 102, 250 or 300, and the differential voltage components Vinm and Vinp of the input signal Isel may be applied to the gates of the transistors 108 and 110. If desired, the preamplifiers 102, 250 and 300 may be elements of, and may perform the desired voltage-to-voltage comparisons in, the voltage-to-delay devices 24, 26, 28, 30 and 32.

Figure 3:
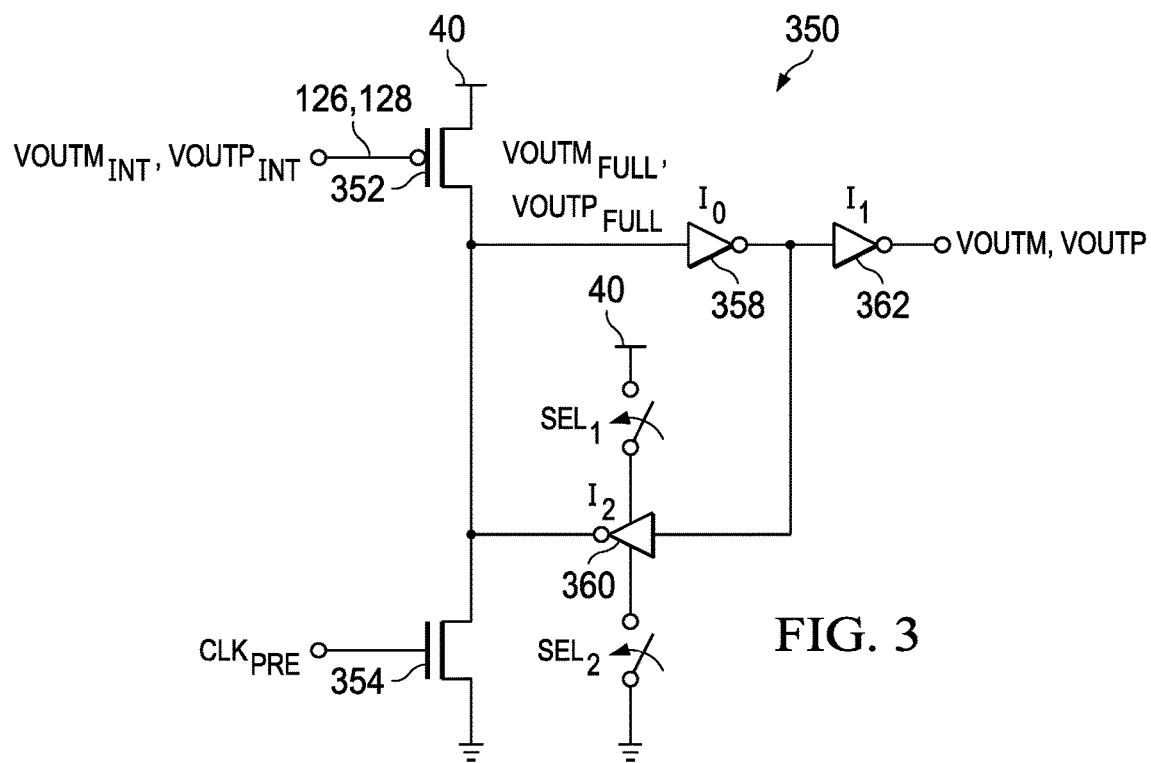
FIG. 3 is a schematic diagram of an example of a second stage for the voltage-to-delay device of FIG. 2.
Figure 2:
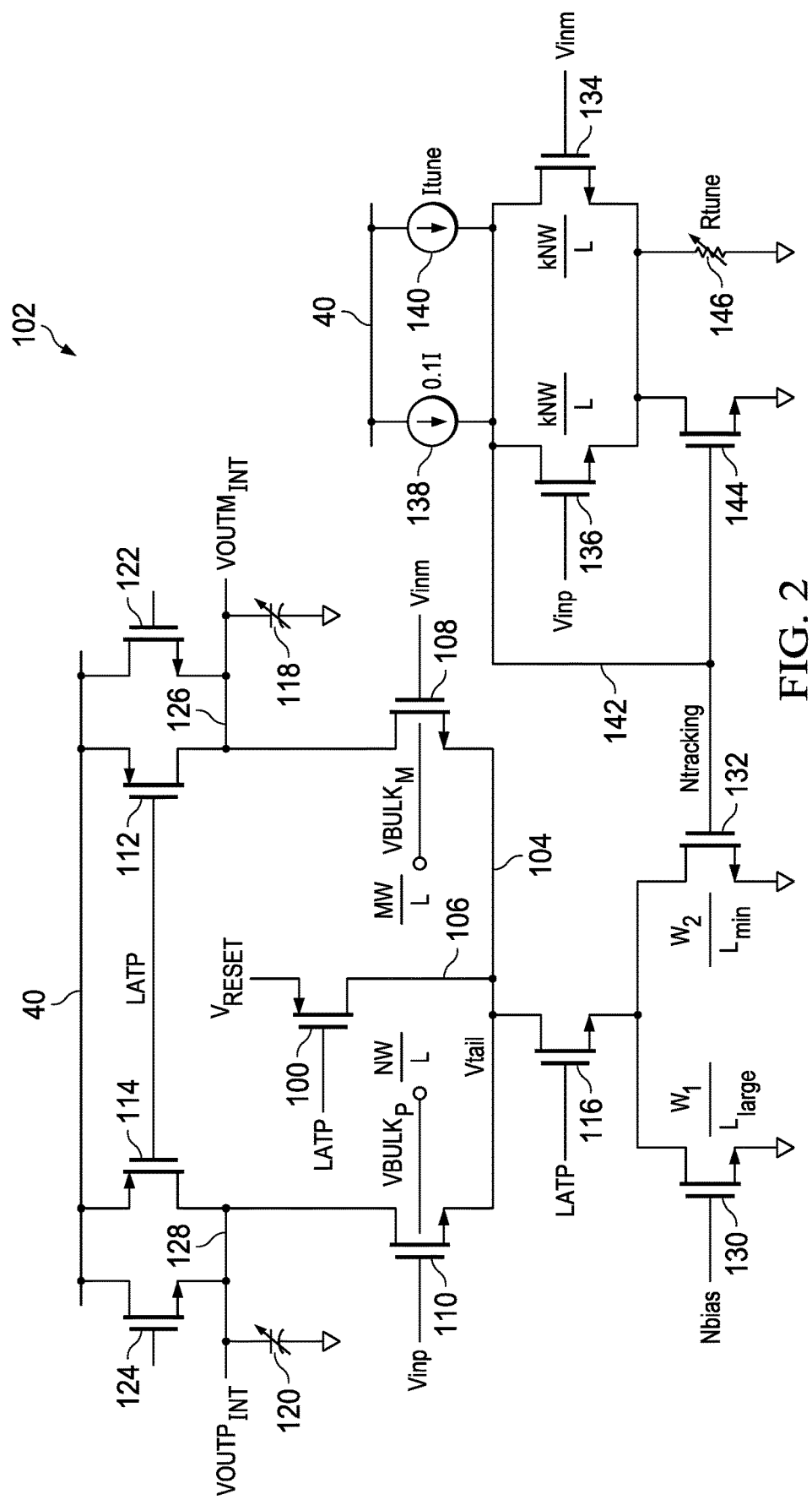
FIG. 2 is a schematic diagram of an example of a current-source-based voltage-to-delay device for the voltage-to-delay converter block of FIG. 1.

According to one aspect of the present disclosure, each one of the voltage-to-delay devices 24, 26, 28, 30 and 32 has first and second stages. As depicted in FIG. 2 for one example embodiment, the first stage includes a voltage-to-delay circuit which generates first and second intermediate output signals VOUTM$_{INT}$ and VOUTP$_{INT}$ based on the differential input voltages Vinm and Vinp (where, as an example, Vinm and Vinp are differential components of the input voltage Vin of the selected signal Isel, and may be expressed as Vin=Vinp−Vinm). The first stage may include, for example, a delay cell with a delay control unit. The first stage may be implemented in various configurations, including one having a current-source-based voltage-to-delay circuit, another having a voltage-source-based voltage-to-delay circuit, and another having a capacitor-based voltage-to-delay circuit. The second stage, an example of which is illustrated in FIG. 3, may be used to convert the intermediate output signals VOUTM$_{INT}$ and VOUTP$_{INT}$ into rail-to-rail signals with a voltage supplied by a supply voltage line 40. Especially where the first stage provides less than desirable rise/fall times, the second stage may cause the voltage-to-delay devices 24, 26, 28, 30 and 32 to have larger gains. In this context, "larger gain" means greater detectable delay. By converting the intermediate output signals VOUTM$_{INT}$ and VOUTP$_{INT}$ into signals of higher voltage, the gains of the respective devices 24, 26, 28, 30 and 32 may be increased.

Figure 4:
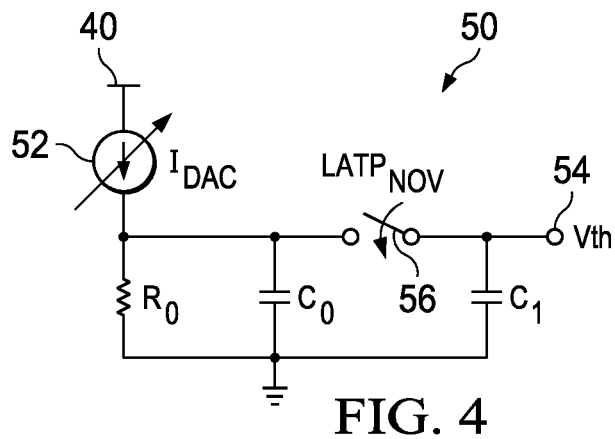
FIG. 4 is a schematic diagram of an example of an in-built circuit for generating a threshold voltage to be applied within the voltage-to-delay device of FIG. 2.
Figure 5:
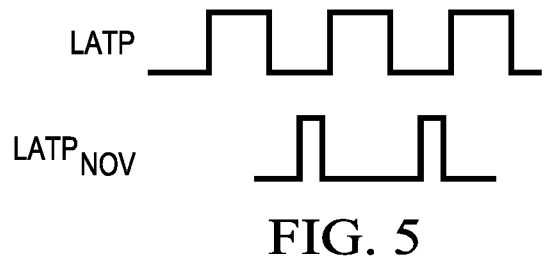
FIG. 5 is a timing diagram for the circuit of FIG. 4.

FIG. 4 shows a circuit 50 for generating and applying a threshold voltage Vth within a first stage of one of the voltage-to-delay devices 24, 26, 28, 30 and 32. FIG. 5 is a timing diagram for the threshold circuit 50. The illustrated circuit 50 has a variable current source 52 which supplies a variable current $I_{DAC}$ as determined by a digital-to-analog converter (not illustrated). (Note that $I_{DAC}$ (FIG. 4) is not necessarily the same is Idac (FIG. 1).) The current source 52 is connected to ground by a resistor $R_0$ and a parallel capacitor $C_0$. The current source 52 is selectively connected to a low-bandwidth node 54 by a switch 56 operated under the control of a reset clock signal LATP$_{NOV}$ (see FIG. 5). The low-bandwidth node 54 is coupled to ground by a second capacitor $C_1$. The voltage at the node 54 during a reset phase, when the reset clock signal LATP$_{NOV}$ is high, is Vth=$I_{DAC}$*$R_0$. The illustrated configuration, which generates the threshold voltage Vth using the variable current source 52, the resistor $R_0$, and the parallel capacitor $C_0$, causes the node 54 to have a finite, low bandwidth. The sampling of this voltage using switch 56 in the reset phase after the respective voltage-to-delay device 24, 26, 28, 30 or 32 is reset avoids previous residue memory at the node 54. Such previous residue memory could otherwise be caused by coupling of the intermediate output signals VOUTM$_{INT}$ and VOUTP$_{INT}$.

In the illustrated configuration, it is desirable to have a stable value for the threshold voltage Vth. The voltage value at node 54 should not change (with time or different values of Vin). The resistor $R_0$ and the capacitors $C_0$ and $C_1$ cause the node 54 to have the desired small bandwidth. If a signal were permitted to couple to the node 54 in one cycle (and if the coupling were dependent on Vin itself), the value of Vth in the next cycle would be affected (and would cause distortion). The sampling method performed by the illustrated configuration can avoid this issue and prevent undesirable memory effects due to finite bandwidth.

In operation, threshold circuits for the various voltage-to-delay devices 24, 26, 28, 30 and 32 may be used to generate in-built threshold voltages of different values, using transistors fabricated to have different threshold voltages ($V_T$) and different sizes. In general, using different-size transistors could degrade the common-mode rejection ratio of the voltage-to-delay array 34, but the structure illustrated in FIG. 4 may help to reduce such degradation. In the illustrated example, the timing of the reset clock signal LATP$_{NOV}$ is such that the switch 56 is open during active phases of the associated voltage-to-delay device, and is closed only after the voltage-to-delay device resets (that is, sufficiently after the clock signal LATP becomes low and the internal nodes of the respective voltage-to-delay device return to their initial state). As a result, the node 54 is connected only to the capacitor $C_1$ when the voltage-to-delay device is active. The node 54 is reset before the switch 56 is closed, and before the node 54 becomes a low-bandwidth node (emulating a zero-bandwidth node). As a result, the threshold circuit 50 supplies only the charge lost due to leakage, and the total charge used per clock cycle is constant. The cyclical operation of the threshold circuit 50 removes previous residue memory during each cycle.

As illustrated in FIG. 2, the differential input voltages Vinm and Vinp are applied to the gates of second and third transistors 108 and 110 of a voltage-to-delay pre-amplifier 102 (an example of a current-source-based first stage). Differential components corresponding to the threshold voltage Vth (generated by the threshold circuit 50) are applied to the bulks (such as the back-gate of the device either through a substrate connection or a connection to a doped "tank" in the substrate in which the device is fabricated) of the second and third transistors 108 and 110, as bulk voltages VBULK$_M$ and VBULK$_P$. A first transistor 100 is connected to a tail node 104 by a suitable line 106. Fourth and fifth transistors 112 and 114 are connected to the supply voltage line 40.

Figure 11:
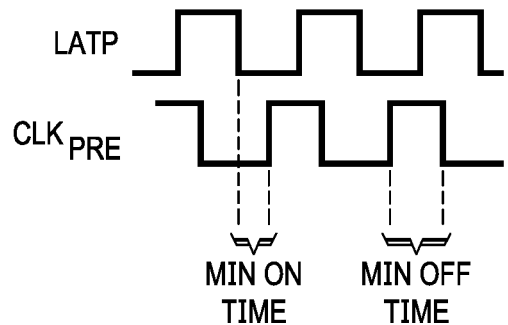
FIG. 11 is a timing diagram for the second stage of FIG. 3.

The gates of the first, fourth and fifth transistors 100, 112 and 114 are operated under the control of the clock signal LATP (illustrated in FIGS. 5 and 11). The pre-amplifier 102 is in an "active" state when the clock signal LATP is high. The differential components of the threshold voltage Vth functionally correspond to VBULK$_M$ and VBULK$_P$ (Vth=A*(VBULK$_P$−VBULK$_M$), where A is a constant). The threshold voltage Vth is reset when the clock signal LATP is low and the reset clock signal LATP$_{NOV}$ is high (see FIG. 5). The differential components VBULK$_M$ and VBULK$_P$ are applied to the bulks of the second and third transistors 108 and 110 to control the second and third transistors 108 and 110. In particular, VBULK$_P$ and VBULK$_M$ may be applied to the bulk or back-gates of respective transistors 110 and 108, while Vinp and Vinm are applied to the gates of the same respective transistors 110 and 108. Another supply voltage V$_{RESET}$, which may be generated from the supply voltage line 40 using a low-dropout regulator (LDO) (not shown in the drawings), is applied to the tail node 104 when the clock signal LATP is low. A current source (discussed in more detail below) is applied to the tail node 104 through a sixth transistor 116. The gate of the sixth transistor 116 is under the control of the clock signal LATP.

In operation, the pre-amplifier 102 generates first and second intermediate output signals VOUTM$_{INT}$ and VOUTP$_{INT}$ during each active phase. The timing of the first intermediate output signal VOUTM$_{INT}$ is based on the difference between the first input voltage Vinm and the voltage Vtail at the tail node 104. The timing of the second intermediate output signal VOUTP$_{INT}$ is similarly based on the difference between the second input voltage Vinp and the tail-node voltage Vtail. In effect, the timing of the intermediate output signals VOUTM$_{INT}$ and VOUTP$_{INT}$ is determined by the voltage difference between Vinm and Vinp. In the illustrated example, as Vin increases, the difference between Vinm and Vinp increases, and therefore, until saturation occurs, the difference in timing between the intermediate output signals VOUTM$_{INT}$ and VOUTP$_{INT}$ increases. In other words, the timing difference between VOUTP$_{INT}$ and VOUTM$_{INT}$ is a function of Vinp–Vinm. The differential input (Vinp–Vinm) is not a fixed value.

Left and right variable capacitors 118 and 120 are provided for calibrating the gain of the pre-amplifier 102. According to one aspect of this disclosure, the capacitances of the variable capacitors 118 and 120 may be changed equally to calibrate the gain of the pre-amplifier 102. According to another aspect of this disclosure, the capacitances of the variable capacitors 118 and 120 may be varied independently, by different amounts, to calibrate the in-built threshold voltage of the pre-amplifier 102. As explained above, the in-built threshold voltage is not VBULK$_P$–VBULK$_M$, but rather is a function of (depends on) VBULK$_P$–VBULK$_M$. The in-built threshold voltage can also depend on many other factors. The capacitances of the variable capacitors 118 and 120 are two such factors. The capacitances of the variable capacitors 118 and 120 can be changed independently to change the in-built threshold voltage of the voltage-to-delay converter.

If desired, each one of the variable capacitors 118 and 120 may be a capacitor array. In the illustrated example, the gains of the preamplifier zones are trimmed by adjusting the tail current Vtail (discussed below) and/or adjusting the variable capacitors 118 and 120. In the illustrated configuration, the pre-amplifier zone for a particular pre-amplifier (an example of a voltage-to-delay device) is the range of input Vin for which the delay difference generated by the pre-amplifier (that is, the delay between VOUTP$_{INT}$ and VOUTM$_{INT}$) does not saturate.

In addition, left and right clamps are incorporated into the left and right branches of the preamplifier 102 to improve delay saturation, and to improve the common-mode rejection ratio of the preamplifier 102 by making sure that the second and third transistors 108 and 110 do not enter linear regions of operation. The illustrated clamps include transistors 122 and 124 located between the supply voltage line 40 and the respective output lines 126 and 128 which carry the intermediate output signals VOUTM$_{INT}$ and VOUTP$_{INT}$. The gates of the clamp transistors 122 and 124 are under the control of a suitable bias voltage.

The tail current source is split into two parts, with a large NMOS transistor 130, with a large W/L value of W$_1$/L$_{large}$, for providing a current of 0.9I, in one part, and a small NMOS transistor 132, with a smaller W/L value of W$_2$/L$_{min}$, for transmitting a current of 0.1I, in the other part. In other example embodiments, the proportion of current provided by transistors 130 and 132 (and the sizing of these transistors) may be different. The gate of the large NMOS transistor 130 is operated under the control of a suitable bias gate voltage Nbias. The gate of the small NMOS transistor 132 is operated under the control of a variable tracking voltage Ntracking. By splitting the tail current source into parallel lines containing the two transistors 130 and 132, the total common-source output impedance (1/gds) for the pre-amplifier 102 can be maintained at a high value, and the Ntracking node applied to the gate of the small NMOS transistor 132 can have a large bandwidth. The small NMOS transistor 132 has a large bandwidth because it is applied to a minimum length (L$_{min}$) device (and thus operates at high speed, or high F$_T$).

The variable gate voltage Ntracking applied to the gate of the small NMOS transistor 132 may be used to cancel changes in the current applied to the tail node 104 caused by changes in the common mode. In the example illustrated in FIG. 2, the first and second input voltages Vinm and Vinp are applied to the gates of transistors 134 and 136. First and second current sources 138 and 140 supply a combined current from the supply voltage line 40 to the transistors 134 and 136, and to the Ntracking node on a suitable line 142. The Ntracking node is also applied to the gate of a discharge transistor 144 (for providing a current of 0.1I), and a variable resistor 146 is connected to the transistors 134 and 136.

In the illustrated example, the current provided by the first current source 138 is 0.1I, and the variable current applied by the second current source 140 is Itune. In the illustrated example, the current I through the tail node transistor 116 equals the current 0.9I through the large transistor 130 plus the current 0.1I through the small transistor 132. The present disclosure should not be limited, however, to the details of the examples described herein. The resistance of the variable resistor 146 is Rtune, which is equal to the output resistance (rds) of the large transistor 130. The size ratios for the transistors 134 and 136 associated with the input voltages Vinm and Vinp are kMW/L and kNW/L, respectively, where k=(0.1I+Itune_nominal)/I, and Itune_nominal is the nominal current provided by the second current source 140. The voltage of the current Itune provided by the second current source 140 is Vtail_nom/Rtune, where Vtail_nom is the nominal voltage at the tail node 104.

In the illustrated example, the tail node reset voltage V$_{RESET}$ is lower than the supply voltage on line 40. But the reset voltage V$_{RESET}$ is high enough to keep the input transistors 108 and 110 off, which reduces memory effects and dissipation of power due to reset. In operation, the input transistors 108 and 110 turn on only after the sixth (tail) transistor 116 discharges the tail node 104 to a common-mode dependent voltage. This ensures that the initial common-mode dependent current does not flow to the output, thus improving the common mode rejection ratio. Also, this ensures that only the common delay of the voltage-to-delay device 102 is affected by the input common mode and not the delay between the intermediate output signals VOUTM$_{INT}$ and VOUTP$_{INT}$. The delay between the intermediate output signals VOUTM$_{INT}$ and VOUTP$_{INT}$ is a function of the nominal current (I), transductance (gm) of the input transistors 108 and 110 of the preamplifier 102, and the difference V$_{diff}$ between the input and output voltages Vinm and Vinp, as follows: delay $\propto \{1/[I/2-(gm \times (V_{diff})/2)]\} - \{1/[I/2+(gm \times (V_{diff})/2)]\} = gm \times V_{diff}(I/2)^2$. In this case, the current value I is realized using the tail transistors 130 and 132.

Figure 6:
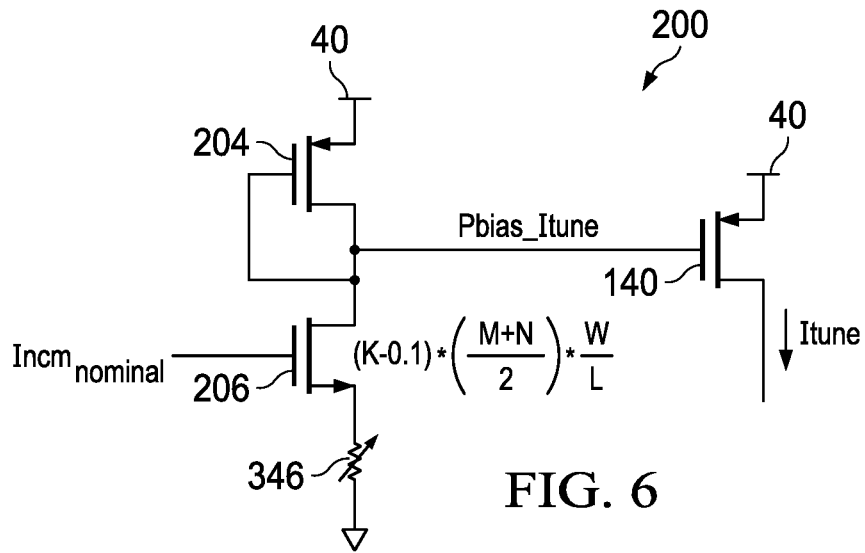
FIG. 6 is a schematic diagram of an example of a circuit for providing a current source for the voltage-to-delay device of FIG. 2.

FIG. 6 is a schematic diagram of a circuit 200 for generating the Itune current shown in FIG. 2. The circuit 200 (FIG. 6) operates by tuning or trimming the resistance of a variable resistor 346. The circuit 200 has first and second transistors 140 and 204 connected to the supply voltage line 40. Second current source 140 (FIG. 2) and first transistor 140 (FIG. 6) are the same element. The value of the current through the first transistor 140 is Itune. The nominal voltage of the common mode of the input signals Incm$_{nominal}$ is applied to the gate of a third transistor 206. The W/L value of the third transistor 206 is (k–0.1)(M+N)W/2 L. The gate of the second transistor 204 is connected to the gate of the first transistor 140, and the gate of the second transistor 204 is connected to the drain of the third transistor 206. The variable resistor 346 is connected between the third transistor 206 and signal ground.

The desired resistance value for the variable resistor 346 may be realized in many ways. In one embodiment, resistor 346 is implemented by linear region transistors with programmable fingers. According to this embodiment, the resistance value is realized during testing/calibration by applying the differential input values Vinm and Vinp with a first mode as the test signal, having a first common mode signal value, then applying the same differential input values Vinm and Vinp with a second mode as the test signal, having a second, different common mode signal value, and then adjusting the resistance value of the variable resistor 346 until the two test signals result in the same output. If desired, the resistance overcompensates for any variation in the tail current and compensates for transductance (gm) and output impedance (1/gds) variation of the input transistors 108 and 110 with common mode. In the example illustrated in FIG. 1, during calibration or adjustment, the differential and common mode input voltages Vinm and Vinp on the known Idac line 14 may be controlled by a digital processor (not illustrated) to have any desired value.

Figure 7:
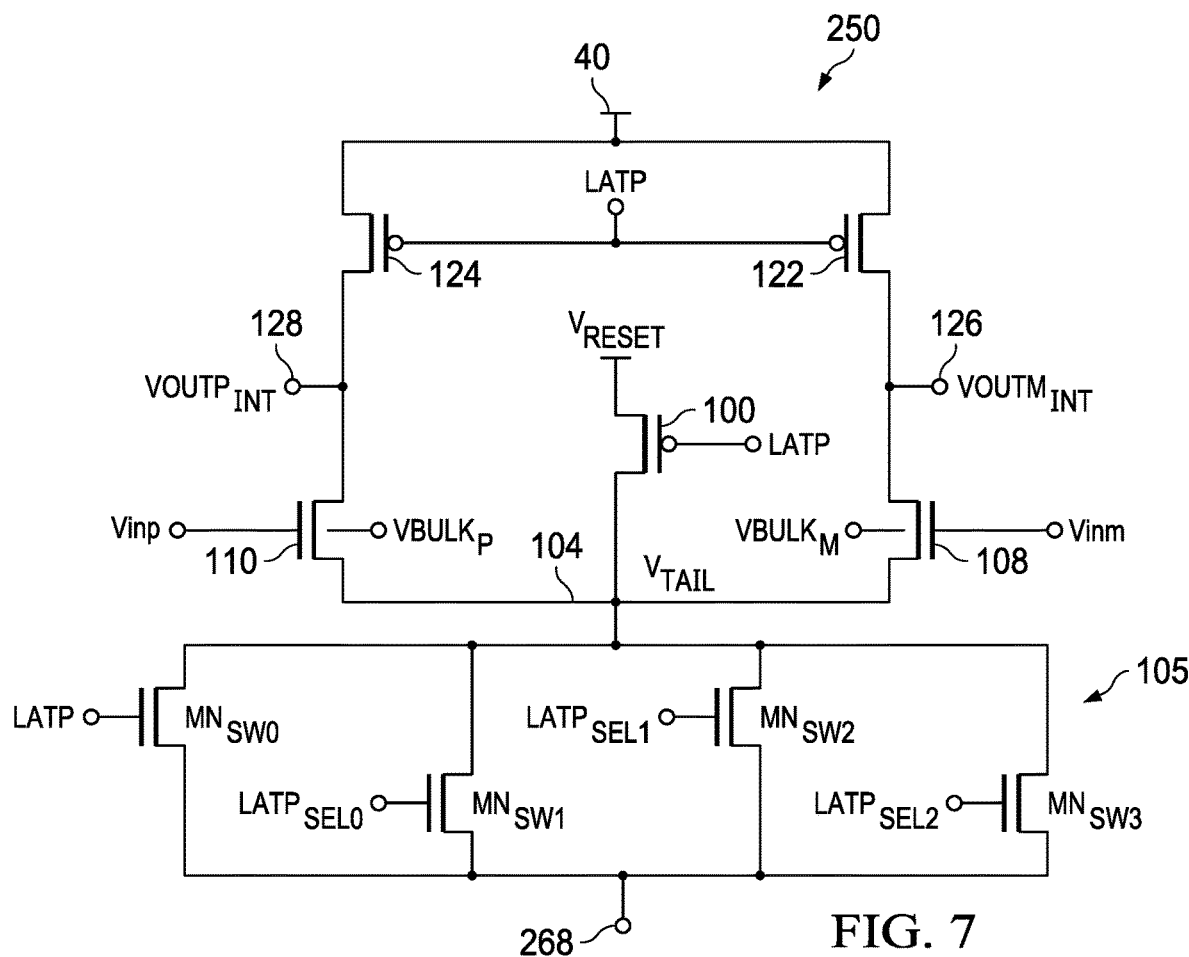
FIG. 7 is a schematic diagram of an example of a voltage-based voltage-to-delay device for the voltage-to-delay converter block of FIG. 1.

FIG. 7 is a schematic diagram of a voltage-source-based pre-amplifier 250 (another example of a first stage) for the system 10 illustrated in FIG. 1. The tail node 104 of the pre-amplifier 250 is reset to a reset voltage $V_{RESET}$ that is less than the voltage on the supply line 40 under the control of the clock signal LATP (when LATP=0) similar to the current-source-based first stage (FIG. 2). The preamplifier 250 (FIG. 7) is in the active phase when the clock signal LATP is high. The intermediate output signals $VOUTM_{INT}$ and $VOUTP_{INT}$ are generated by comparing the input voltages Vinm and Vinp to the voltage on the tail node 104. Thus, as illustrated in FIG. 7, the tail node 104 operates as a voltage source in the active phase with a value corresponding to that of the voltage source connected to a node 268. The voltage $V_{TAIL}$ on the tail node 104 is generated by a flipped voltage follower (FVF) circuit 254 illustrated by way of example in FIG. 8. As explained below, switches are located between the tail node 104 and node 268 to increase or decrease current in the circuit.

Figure 8:
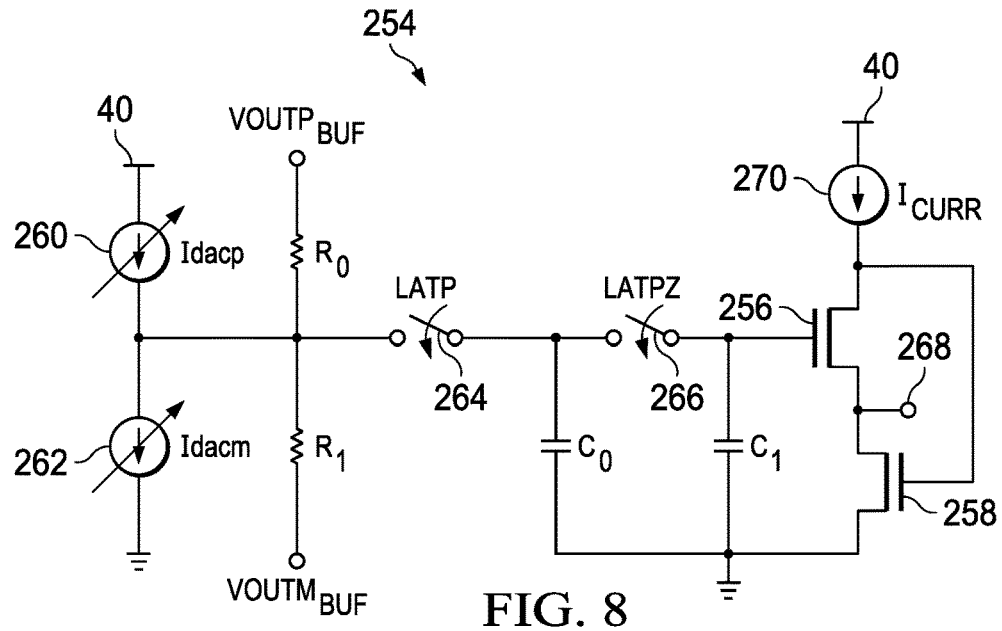
FIG. 8 is a schematic diagram of an example of a circuit for generating a tail node voltage for the voltage-to-delay device of FIG. 7.

The currents through the left and right branches of the pre-amplifier 250 are independent of each other. The term "branches" is used here to refer to the right and left parts of the preamplifier 250 illustrated in FIG. 7 (an example of a voltage-to-delay device). In the configuration illustrated in FIG. 7, the left branch generates $VOUTP_{INT}$ while the other branch generates $VOUTM_{INT}$.) Therefore, the pre-amplifier 250 does not require a voltage clamp. The pre-amplifier 250 provides high gain (the gain does not saturate but increases as the input voltages Vinm and Vinp increase). Moreover, the pre-amplifier 250 uses a low amount of current, because each zone switches off after a decision (the generation of an intermediate output signal $VOUTM_{INT}$ and $VOUTP_{INT}$) is made. Also, the earlier one of the intermediate output signals $VOUTM_{INT}$ and $VOUTP_{INT}$ does not saturate and can be generated faster than in the current-source-based first stage (FIG. 2), thereby improving the total gain for a given time period. In the illustrated configuration, gain is controlled by controlling the voltage applied to the tail source node 268 (generated using a flipped voltage follower (FVF) circuit described below) and the strength of switches $MN_{SW0}$, $MN_{SW1}$, $MN_{SW2}$ and $MN_{SW3}$ by making $LATP_{SEL0}$, $LATP_{SEL1}$ and $LATP_{SEL2}$ equal to LATP or 0 (that is, turned on or off respectively). FIG. 8 shows the source (the flipped voltage follower circuit 254) of the voltage applied to node 268 in the example embodiment of FIG. 7. The circuit illustrated in FIG. 8 is a common-mode feed-forward (CMFF) circuit for generating the desired voltage at node 268. The circuit 254 has first and second NMOS transistors 256 and 258. A voltage is generated by the difference between first and second variable current sources 260 and 262. The variable current sources 260 and 262 are operated by a digital-to-analog converter. The resistors $R_0$ and $R_1$ are used to sense the input common mode for the first stage of the voltage-to-delay converter cell. In operation, the difference between the variable current sources 260 and 262 flows through the resistors $R_0$ and $R_1$ to generate a voltage VCM+/−A, where A depends on the difference between current sources 260 and 262 and the values of $R_0$ and $R_1$. The voltage is selectively connected to the first NMOS transistor 256 through first and second switches 264 and 266.

Figure 9:
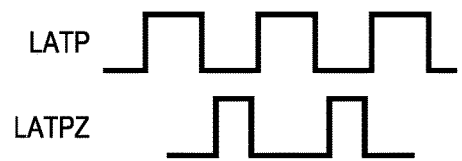
FIG. 9 is a timing diagram for the device and circuit of FIGS. 7 and 8.

The first switch 264 is operated under the control of the clock signal LATP. The second switch 266 is operated under the control of another clock signal LATPZ having timing related to, but with a different duty cycle than, the clock signal LATP. As illustrated in FIG. 9, whenever the first clock signal LATP is high, the second clock signal LATPZ is low, and whenever the second clock signal LATPZ is high, the first clock signal is low, but the duty cycle of the second clock signal LATPZ is not the same as that of the first clock signal LATPZ. In particular, the second clock signal LATPZ becomes high after the first clock signal LATP becomes low, and the second clock signal LATPZ becomes low before the first clock signal LATP becomes high. In FIG. 8, buffer output voltages $VOUTM_{BUF}$ and $VOUTP_{BUF}$ are the voltages of respective differential components of the selected signal $I_{SEL}$ output by the buffer 22 shown in FIG. 1. Regardless of whether Isel is based on Iin or Idac, $VOUTM_{BUF}$=Vinm, and $VOUTP_{BUF}$=Vinp. The first and second switches 264 and 266 are connected to ground through respective capacitors $C_0$ and $C_1$. The second NMOS transistor 258 is located between node 268 and ground. Current $I_{CURR}$ from a third current source 270 selectively flows through the first NMOS transistor 256 and the second NMOS transistor 258.

Node 268 of the voltage source 254 is connected to the tail node 104 (FIG. 7) of the preamplifier 250 through an array of parallel NMOS transistors 105 controlled as a function of the clock signal LATP. Clocking signals $LATP_{SEL0}$, $LATP_{SEL1}$ and $LATP_{SEL2}$ each have the same timing as clock LATP, but $LATP_{SEL0}$, $LATP_{SEL1}$ and $LATP_{SEL2}$ may have different magnitudes than LATP. The three additional transistors ($MN_{SW1}$, $MN_{SW2}$ and $MN_{SW3}$) are used to selectively control the resistance of the switch 105 connecting the node 268 to the tail node 104 when the clock signal LATP is on. When it is desired to reduce the resistance, or improve strength, one or more of $LATP_{selk}$ may be equal to LATP, and to reduce strength, one or more of $LATP_{SELk}$ may be equal to 0, where k=0, 1, 2 . . . . In this context, to "improve strength" means to increase current in the circuit during the active phase (when LATP=1), whereas to "reduce strength" means to decrease current in the circuit during the active phase (when LATP=1). Improved strength leads to faster outputs. Note that although the illustrated configuration has three extra switches $MN_{SW1}$, $MN_{SW2}$ and $MN_{SW3}$, the present disclosure is not limited to the illustrated configuration, which is only an example.

Figure 10:
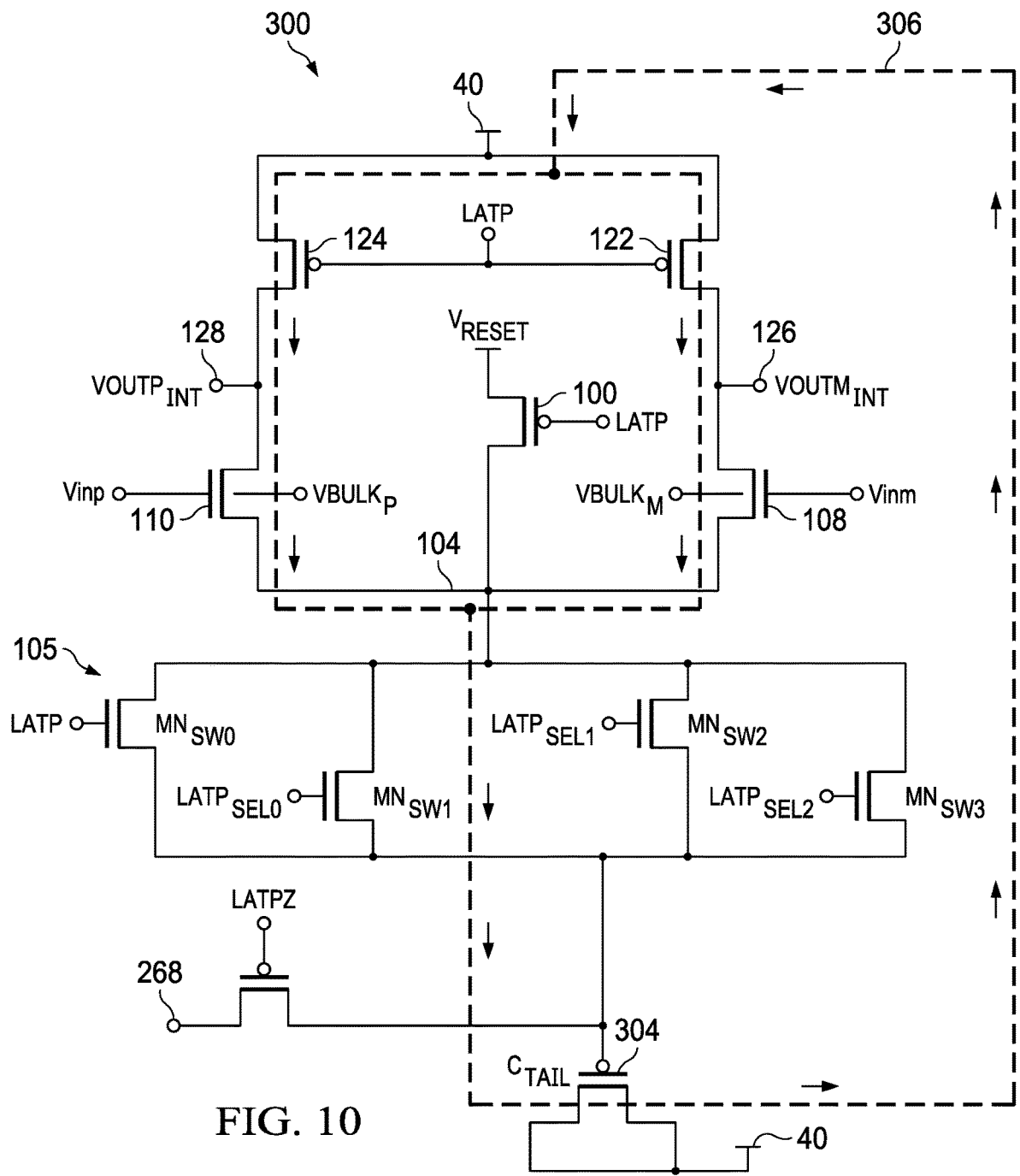
FIG. 10 is a schematic diagram of an example of a capacitor-based voltage-to-delay device for the voltage-to-delay converter block of FIG. 1.

FIG. 10 illustrates a capacitor-based pre-amplifier 300 which is a third example of a first stage for the system 10 of FIG. 1. The pre-amplifier 300 is the same as the one shown in FIG. 7, except that the tail node 104 for pre-amplifier 300 is capacitor-based. Under the control of the complement clock signal LATPZ, the voltage on node 268 generated by the flipped voltage follower circuit 254 (FIG. 8) pre-charges a tail capacitor 304. The gain of the pre-amplifier 300 may be improved by adjusting the pre-charge value and modifying the strength of a switch 105 (the same structure as illustrated in FIG. 7) turned on in accordance with the clock signal LATP, where the switch 105 is connected between the capacitor 304 and the tail node 104.

In the active phase, when the clock signal LATP is high, the output voltages VOUTM$_{INT}$ and VOUTP$_{INT}$ fall. This causes the capacitor 304 to charge and increases the voltage at the tail node 104. This in turn reduces the current through the input transistors 108 and 110, causing the rate of fall of the intermediate node voltages VOUTM$_{INT}$ and VOUTP$_{INT}$ to reduce, causing an exponentially settling waveform. This prevents the output from falling quickly below a threshold of the second stage, and thereby increases gain. (The second stage is illustrated in FIG. 3 and discussed below.) Also, since the input transistors 108 and 110 have high overdrive ($V_{GS}$-$V_T$) initially, the common mode sensitivity of the illustrated circuit is inherently reduced.

In the example illustrated in FIG. 10, a PMOS transistor 304 is used as a capacitor between the tail node 104 and the voltage supply line 40. An external inductor (not illustrated), among other things (not illustrated), may be used to establish the supply voltage on supply voltage line 40. Current drawn by the pre-amplifier 300 forms a local loop 306 and does not flow through the external inductor for the supply line 40, thus reducing parasitic routing sensitivity of the supply line 40. The local loop 306 is illustrated by broken lines in FIG. 10. The effective capacitance provided by the transistor 304 is reduced as the intermediate output voltages VOUTM$_{INT}$ and VOUTP$_{INT}$ fall, which further increases the gain of the preamplifier 300.

Figure 14:
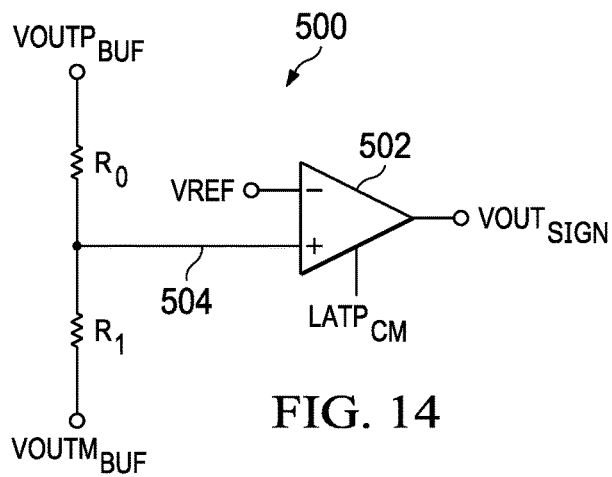
FIG. 14 is a block diagram of a portion of a calibration circuit for the voltage-to-delay converter block of FIG. 1.
Figure 15:
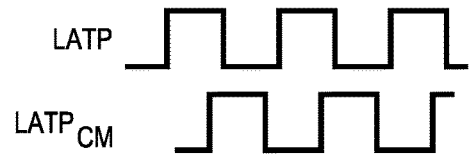
FIG. 15 is a timing diagram for the circuit of FIG. 14.
Figure 16:
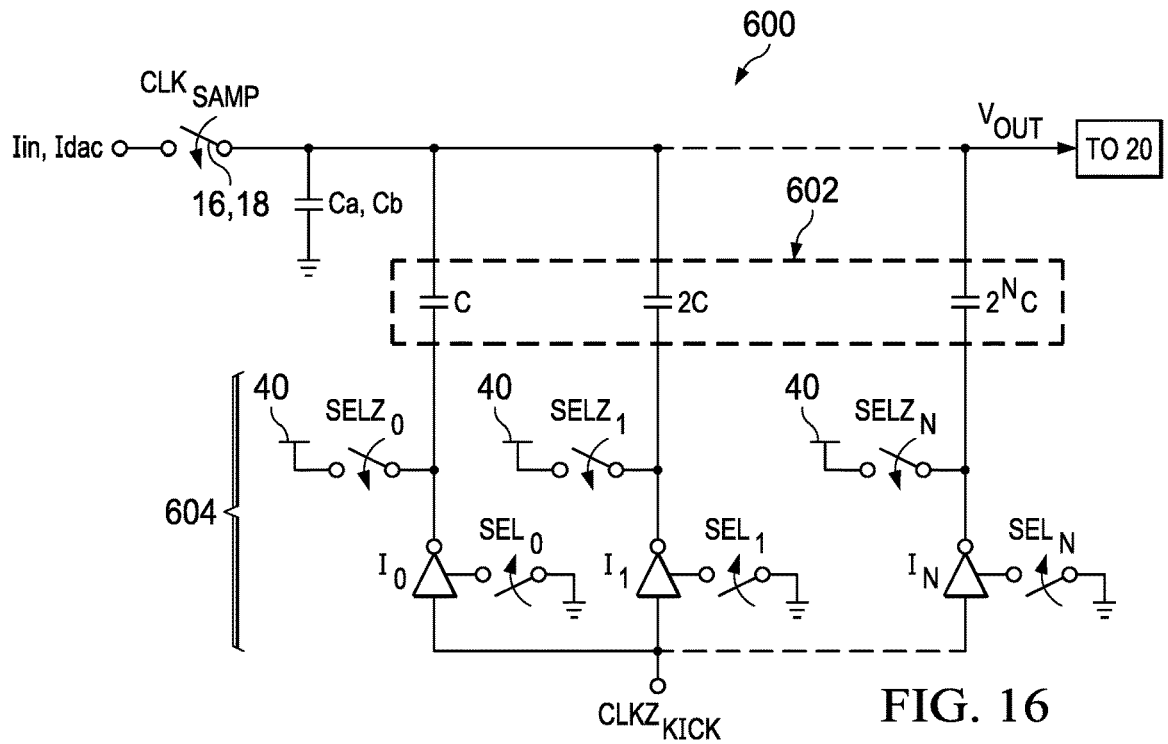
FIG. 16 is a schematic diagram of another portion of the calibration circuit, which portion may be used to selectively increase or decrease a sampled voltage.
Figure 17:
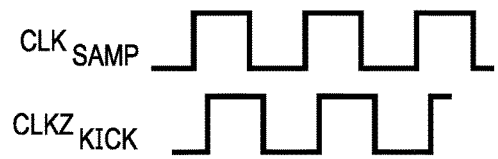
FIG. 17 is a timing diagram for the circuit of FIG. 16.

Referring now to FIGS. 14 and 16, the circuits 500 and 600 illustrated therein may be used to ensure that the common mode of the selected input signal I$_{SEL}$ (FIG. 1) is the same regardless of whether the input to the voltage-to-delay block 10 is the analog signal tin of unknown voltage or the signal Idac of known voltage (the latter being a signal generated by a suitable digital-to-analog converter, as mentioned above). The circuit 500 illustrated in FIG. 14 is located between the buffer 22 and the voltage-to-delay array 34, and buffer output voltages VOUTM$_{BUF}$, VOUTP$_{BUF}$ are the voltages Vinm and Vinp of the differential outputs of the buffer 22, as mentioned above. The resistors R$_0$ and R$_1$ are used to sense the common mode from the output of the buffer 22. The sensed common-mode signal is supplied, by a high-bandwidth node 504, to a comparator 502 that is triggered by a common-mode clock signal LATP$_{cm}$ (see FIG. 15). The comparator 502 detects whether the common-mode voltage (on node 504) is above or below a threshold VREF, and generates a representative digital output signal VOUT$_{SIGN}$ which is given to a digital circuit (not illustrated). The common mode of the sampled signal (Iin or Idac, as the case may be) is then increased or decreased by the circuit 600 illustrated in FIG. 16, based on the value of the comparator sign VOUT$_{SIGN}$.

The output signal VOUT$_{SIGN}$ is averaged in the digital circuit (to reduce noise) and then used to operate the circuit 600 illustrated in FIG. 16 to change the common mode of the input signal (Vin or Vdac) using a capacitor array 602 controlled by select signals SEL$_0$ through SEL$_N$. The capacitors of the capacitor array 602 have different capacitances C, 2C . . . 2$^N$C. If desired, two circuits 600 may be employed, one (with switch 16 and capacitor Ca) for the first input of the multiplexer 20, and another circuit 600 (with switch 18 and capacitor Cb) for the second input of multiplexer 20. The circuit(s) 600 may be located between switches 16 and 18 and the multiplexer 20. In each case, the output Vout of the circuit 600 is transmitted to the multiplexer 20.

The circuit 600 increases or decreases the common mode of the input voltage Iin and Idac by an amount that is controlled by the select signals SEL$_0$ through SEL$_N$, and thereby changes the common mode of the output Isel of the buffer 22. Then the comparator 502 is triggered again and the process is repeated until the buffer common mode (that is, the common mode of the output Isel from the buffer 22) becomes equal to VREF. The process is done separately for the unknown input signal Iin and the known input signal Idac, and the corresponding increases/decreases are controlled separately using the capacitors of the capacitor array 602, such that the buffer output common mode for either input signal Iin, Idac is equal to VREF (and thereby equal to each other). The process is implemented using an array of inverters 604 (I$_0$, I$_1$ . . . I$_N$) which are controlled in accordance with the respective select signals SEL$_0$, SEL$_1$ . . . SEL$_N$, respective voltage sources connected by switches closed in accordance with complements of the respective select signals SELZ$_0$, SELZ$_1$ . . . SELZ$_N$, and the respective capacitors 602, to increase/decrease the sampler output V$_{OUT}$. In the configuration illustrated by way of example in FIG. 16, Vdd is the same voltage as that on supply line 40. The selective operation of the select signals SEL$_0$, SEL$_1$ . . . SEL$_N$ may be determined by a digital processor, so as to control the FIG. 16 circuit 600 as desired based on output signals VOUT$_{SIGN}$ generated by the comparator 502.

Thus, the circuits 500 and 600 may be used to calibrate the analog-to-digital converter system 10 using a linear digital-to-analog converter (not illustrated). The circuits 600 may be particularly helpful where the voltage-to-delay array 34 would otherwise have poor common-mode rejection ratio. The circuits are operated on the principle that common mode should be the same for a calibration phase (when the known signal Idac is sampled) as for an actual, operational phase (when the unknown signal tin is sampled).

The circuits illustrated in FIGS. 14 and 16 employ a digital loop, from VOUT$_{SIGN}$, through the digital processor (not illustrated), to control the inverter array 604, to thereby cause the respective common modes to match. In operation, the differential buffer outputs VOUTM$_{BUF}$ and VOUTP$_{BUF}$ are sensed at a high bandwidth node 504, and the common mode of those outputs VOUTM$_{BUF}$ and VOUTP$_{BUF}$ is compared to a reference voltage VREF by the comparator 502. The comparator 502 operates in phase with the clock signal LATP and is triggered by a common-mode clock signal LATP$_{CM}$ just before the clock signal LATP switches off, as illustrated in FIG. 15. The illustrated circuit removes kick-back effect and senses common mode during the active phase.

Each one of the pre-amplifiers 102, 250 and 300 described above generate intermediate output signals VOUTM$_{INT}$ and VOUTP$_{INT}$, on lines 126 and 128, respectively, which are delay signals corresponding to the voltages Vinm and Vinp of differential input signals. FIG. 3 illustrates a circuit 350 (an example of a second stage) for converting the first intermediate output signal VOUTM$_{INT}$, on line 126 (or the second intermediate output signal VOUTP$_{INT}$, on line 128) into a corresponding rail-to-rail signal VOUTM (or VOUTP, respectively). The circuit 350 has a PMOS transistor 352 and an NMOS transistor 354 located between the supply voltage line 40 and ground. In the illustrated example, first intermediate output signal VOUTM$_{INT}$ is applied to the gate of the PMOS transistor 352 (or the second intermediate output signal VOUTP$_{INT}$ is applied to the gate of the PMOS transistor 352). As a result, an output signal VOUTM$_{FULL}$ (or VOUTP$_{FULL}$) with the timing of the intermediate output signal VOUTM$_{INT}$ (or VOUTP$_{INT}$, respectively) but the full voltage of the supply voltage line 40 is applied to a latch (including an inverter 360) around a first inverter 358.

A skewed clock signal CLK$_{PRE}$ (see FIG. 11) is applied to the gate of the NMOS transistor 354 of the second-stage circuit 350. Inverter 360 is enabled by closing switches under the control of select signals SEL$_1$ and SEL$_2$. The final output signal VOUTM (or VOUTP) is generated by a third inverter 362. The final output signal VOUTM (or VOUTP) has similar timing as the intermediate output voltage VOUTM$_{INT}$ (or VOUTP$_{INT}$, respectively) but the voltage of the supply voltage line 40. Two separate circuits 350, each one like the one illustrated in FIG. 3, may be used to operate on intermediate output signals VOUTM$_{INT}$ and VOUTP$_{INT}$, and convert the intermediate output signals VOUTM$_{INT}$ and VOUTP$_{INT}$ into corresponding, respective, rail-to-rail output signals VOUTM and VOUTP. The rail-to-rail output signals may be supplied as inputs to a suitable backend time (or delay)-to-digital converter.

In the illustrated configuration, the timing and operation of the select signals SEL$_1$ and SEL$_2$ may be programmable so that the latch illustrated in FIG. 3 may be turned on and off in any desired direction.

The second-stage circuit 350 improves the rise/fall times of the intermediate output signals VOUTM$_{INT}$ and VOUTP$_{INT}$, and therefore helps to provide a larger gain from the first stage (and hence compensate for unsatisfactory rise/fall times in the first stage 102, 250 and 300). The pre-charged, fully dynamic circuit 350 ensures a minimum on time and a minimum off time (see FIG. 11) for the final rail-to-rail outputs VOUTP and VOUTM. This removes the need to route small pulses and provides enough reset and active time for easy operation of the backend time-to-digital converter. The latch around the first inverter 358 ensures fast detection of the threshold for the second-stage circuit 350 by turning on SEL$_1$. Also, across all expected process, voltage, and temperature (PVT) conditions, an adequate programmability in the threshold for the PMOS transistor 352 can be obtained using the latch, by turning on SEL$_2$. As a result, the PMOS transistor 352, when in deep sub-threshold region does not cause VOUTP (VOUTM) to rise slowly as it is overpowered by the latch. This, in turn, results in lower noise due to leakage in the PMOS transistor 352, hence providing a programmable threshold voltage by programing SEL$_2$ and selecting the size of NMOS in the inverter 360.

Figure 12:
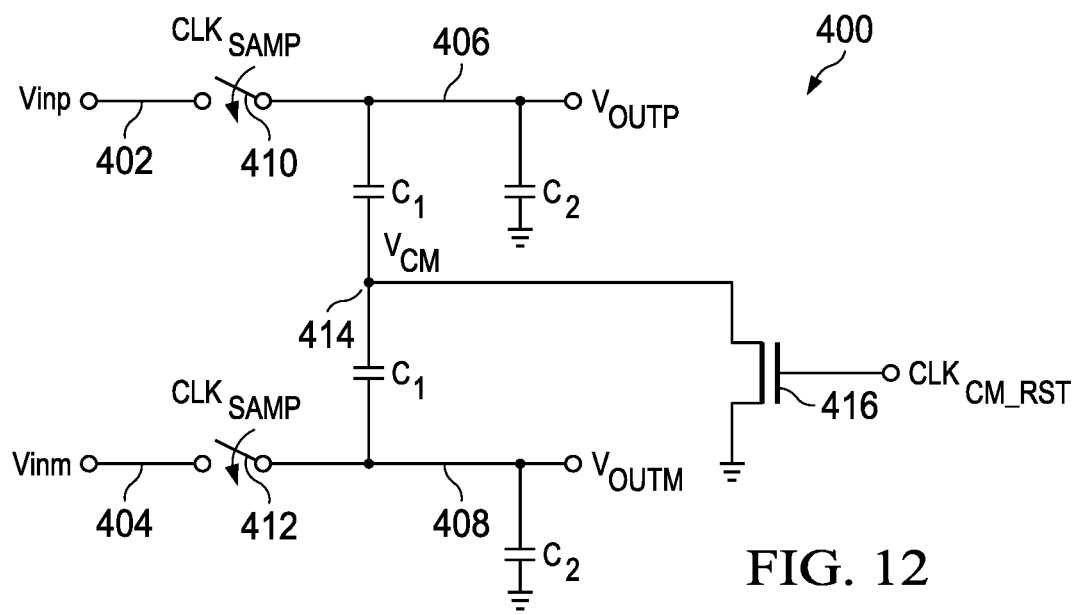
FIG. 12 is a schematic diagram of an example of a circuit for sampling input signals and removing common mode signals.
Figure 13:
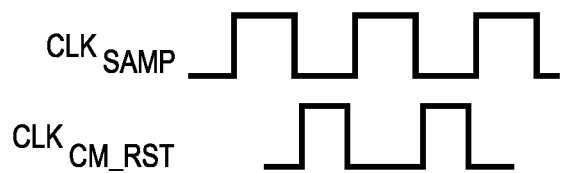
FIG. 13 is a timing diagram for the circuit of FIG. 12.

FIG. 12 illustrates a circuit 400 for sampling differential input voltages Vinm and Vinp on input lines 402 and 404, respectively, during a sampling phase, and discharging a common mode voltage Vcm from the circuit 400 during a hold phase, to provide an improved common-mode rejection ratio. A middle node is discharged from Vcm to 0 (or another suitable voltage) in the hold phase. The input lines 402 and 404 are selectively connected to output lines 406 and 408 by switches 410 and 412 which are closed when a sample clock signal CLK$_{SAMP}$ is high (see FIG. 13). The output lines 406 and 408 are connected to a the middle node 414 through first capacitors C$_1$. The output lines 406 and 408 are connected to ground through second capacitors C$_2$. In the illustrated configuration, the middle node 414 is selectively connected to ground through a transistor 416 which is operated under the control of a reset clock signal CLK$_{CM\_RST}$.

During a sample phase, the sample clock signal CLK$_{SAMP}$ is high and the reset clock signal CLK$_{CM\_RST}$ is low, such that the switches 410 and 412 are closed, the voltage on the middle node 414 is the common-mode voltage Vcm, and the voltages on the output lines 406 and 408 are sums of the input and common mode voltages Vinm+Vcm (line 408) and Vinp+Vcm (line 406) (where Vcm denotes the change in common mode from the input lines 402 and 404 and Vinp and Vinm are the voltages of the differential input signals). During a hold phase, the sample clock signal CLK$_{SAMP}$ is low and then the reset clock signal CLK$_{CM\_RST}$ is turned high, such that the switches 410 and 412 are opened. Subsequently, the voltage on the middle node 414 is discharged to ground, and the voltages on the output lines 406 and 408 are the input voltages Vinm and Vinp, such that the common mode is rejected at the end of the hold phase.

The circuit 400 may be used to improve the operation of a voltage-to-delay block which would otherwise have a poor common-mode rejection ratio, and in which a common-mode signal would cause higher-order non-linearities due to input dependent common-mode rejection ratio (CMRR). In general, and by way of example, the common mode signal may be created by phase/amplitude imbalance in one or more transformers (not shown in the drawings). The circuit 400 illustrated in FIG. 12 may be used to improve the operation of such a device by resetting (discharging) the common mode during hold phases. In the illustrated example, the common mode transfer function is $C_2/[(C_1+C_2)-C_1Z^{-1}]$. Further, the common mode signal may be created due to even order non-linearities in the differential sampling circuit due to the switches 410 and 412 (FIG. 12). The transfer function for such common mode signals is: $C_2/[(C_1+C_2)]$. Here $C_1$ denotes the part of the sampling capacitor that can be controlled and $C_2$ denotes the parasitic capacitors that cannot be controlled using the middle switch 416.

In summary, the present disclosure relates to a fully-dynamic analog-to-digital converter system, the performance of which improves with complementary metal-oxide-semiconductor scaling. The system may have first and second stages. The first stage may be in the form of a voltage-to-delay array at the front end of a pipeline analog-to-digital converter. Especially when the voltage-to-delay components of such an array operate in non-linear regions, the present disclosure may be helpful in terms of improving gain and reducing power and area requirements. The present disclosure is not limited to such use, however. If desired, a backend time-to-digital converter may be operated at the combined output of the second stage of the illustrated system.

The present disclosure describes a number of advantageous features, including the ability to calibrate using a linear low-speed digital-to-analog converter, and providing voltage-to-delay components with in-built thresholds which may reduce power by up to four times or more. In the examples illustrated herein, a threshold voltage may be trimmed using a back-gate which is opened in an active phase and reset after a pre-amplifier is reset. Also, the devices described herein may be used to remove residue-dependent memory within the in-built thresholds.

The second stage may be connected to the first stage to convert intermediate output signals to rail-to-rail signals. A pre-charge logic with skewed clock may be used to ensure minimum on and off pulse widths. Reduction of noise may be achieved by providing a latch around an inverter.

In a current-source-based voltage-to-delay circuit (an example of a first stage), a tail node may be reset to a voltage that is lower than the supply voltage, to thereby reduce power consumption. The reset voltage turns off the tail node in a sample phase, which provides an improved common-mode rejection ratio. Moreover, clamps may be provided at the output nodes, where the intermediate output signals are generated, which can improve the common-mode rejection ratio and improve gain without saturation.

According to the present disclosure, the first stage may alternatively be implemented by a voltage-source-based voltage-to-delay device, which may be a pre-amplifier. Higher gain may be achieved by having currents in separate branches of the pre-amplifier be independent of each other. Moreover, the pre-amplifier may have low power consumption, because current is switched off after an output signal decision is made. A common-mode feed forward (CMFF) structure may be used to improve the common-mode rejection ratio.

Further, according to the present disclosure, the first stage may be implemented by a capacitor-based voltage-to-delay device, which may be a pre-amplifier. The capacitor-based pre-amplifier may have improved gain, especially because it causes the output signal to settle exponentially. In the illustrated example, a PMOS transistor is used as a capacitor. The transistor forms a local current loop; the current does not flow through parasitic supply inductance. In general, providing a greater difference between gate-source voltage ($V_{GS}$) and threshold voltage ($V_T$) also improves common-mode rejection ratio (CMRR).

The present disclosure also relates to circuits for matching the common mode of the known input signal Idac to that of the unknown input signal Iin.

Finally, the present disclosure relates to a differential sampling circuit for removing common mode signals to further improve the common mode rejection ratio.

If desired, some or all of the elements of the devices and systems described herein may be integrated into an integrated circuit (IC) and/or a chip (not shown in the drawings) and/or formed on or over a single semiconductor die (not shown in the drawings) according to various semiconductor and/or other processes. The conductive lines may be metal structures formed in insulating layers over the semiconductor die, doped regions (that may be silicided) formed in the semiconductor die, or doped semiconductor structures (that may be silicided) formed over the semiconductor die. Transistors used to implement the circuit structures of the example embodiments may be bipolar junction transistors (BJT) or metal-oxide-semiconductor field-effect transistors (MOSFET) and can be n-type or p-type. The integrated devices and elements may also include resistors, capacitors, logic gates, and other suitable electronic devices that are not shown in the drawings for the sake of clarity.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A multi-stage voltage-to-delay converter for converting input signals into delay signals, comprising:
a first stage for receiving the input signals and for generating intermediate output signals, wherein timing of the intermediate output signals corresponds to voltages of the input signals, and wherein the first stage has a voltage source for providing a rail-to-rail voltage; and
a second stage, connected to the first stage, for receiving the intermediate output signals and for generating rail-to-rail output signals, wherein timing of the rail-to-rail output signals corresponds to the timing of the intermediate output signals, and wherein voltages of the rail-to-rail output signals correspond to the rail-to-rail voltage of the voltage source.

2. The voltage-to-delay converter of claim 1, further comprising an in-built threshold circuit for providing a threshold voltage, and wherein the timing of the intermediate output signals corresponds to differences between the threshold voltage and the voltages of the input signals.

3. The voltage-to-delay converter of claim 2, wherein the in-built threshold circuit includes a reset switch for removing residue memory voltage from a node of the in-built threshold circuit, wherein the voltage-to-delay converter is configured such that an input signal for the in-built threshold circuit is sampled before an active phase of the voltage-to-delay converter, wherein the node is reset after a voltage-to-delay conversion, and wherein the node is coupled to signal ground through a capacitor.

4. The voltage-to-delay converter of claim 2, wherein the first stage includes a current-source-based device.

5. The voltage-to-delay converter of claim 4, wherein the current-source-based device includes a preamplifier having a resettable tail node, and a current source for adjustably providing current to the tail node.

6. The voltage-to-delay converter of claim 5, wherein the preamplifier has at least one clamp to improve delay saturation, and to improve common-mode rejection ratio of the preamplifier.

7. The voltage-to-delay converter of claim 5, wherein the preamplifier further comprises at least one variable capacitor for trimming at least one of the intermediate outputs to control gain.

8. The voltage-to-delay converter of claim 5, further comprising a tail source coupled to the tail node, and wherein the tail source includes parallel lines containing respective transistors for thereby providing low total output conductance (gds).

9. The voltage-to-delay converter of claim 5, further comprising a variable resistor for overcompensating for variation in the tail current, and for compensating for transconductance (gm) and output impedance (1/gds) variation of input transistors with common mode.

10. The voltage-to-delay converter of claim 2, wherein the first stage includes a voltage-source-based device.

11. The voltage-to-delay converter of claim 10, wherein the voltage-source-based device includes a preamplifier having a resettable tail node, and a flipped voltage follower circuit for adjustably applying voltage to the tail node.

12. The voltage-to-delay converter of claim 10, wherein the first stage includes a common-mode feed-forward circuit for generating tail node voltage.

13. The voltage-to-delay converter of claim 11, further comprising a programmable array of tail node switches between the tail node and flipped voltage follower circuit.

14. The voltage-to-delay converter of claim 2, wherein the first stage includes a capacitor-based device.

15. The voltage-to-delay converter of claim 14, wherein the capacitor-based device includes a preamplifier having a resettable tail node, a capacitor connected to the tail node in the active phase, and a flipped voltage follower circuit for adjustably pre-charging the capacitor.

16. The voltage-to-delay converter of claim 15, wherein the preamplifier includes a capacitor between the tail node and a supply line to loop current locally within the preamplifier, and to thereby reduce the effect of a parasitic inductor.

17. The voltage-to-delay converter of claim 16, further comprising a programmable array of tail node switches between the tail node and the capacitor.

* * * * *